United States Patent [19]

Bishop et al.

[11] 4,016,558
[45] Apr. 5, 1977

[54] APPARATUS FOR CONVERTING A PLURALITY OF SIGNALS REPRESENTATIVE OF DIGITAL BITS OF INFORMATION TO AN ANALOG SIGNAL

[75] Inventors: Everett Reece Bishop; Marcel Henri Leroux, both of Waynesboro, Va.

[73] Assignee: General Electric Company, New York, N.Y.

[22] Filed: June 27, 1975

[21] Appl. No.: 590,940

[52] U.S. Cl. .................... 340/347 DA; 340/347 M; 235/92 MP; 235/151.11
[51] Int. Cl.² ...................................... H03K 13/00
[58] Field of Search ............ 340/347 DA, 147 MT; 235/92 MP, 151.11

[56] References Cited
UNITED STATES PATENTS

| | | | |
|---|---|---|---|
| 3,422,423 | 1/1969 | Kaszynski et al. | 340/347 DA |
| 3,573,803 | 4/1971 | Chatelon et al. | 340/347 DA |
| 3,707,713 | 12/1972 | Diaz et al. | 340/347 DA |
| 3,728,718 | 4/1973 | Dresser et al. | 340/347 DA |

*Primary Examiner*—Thomas J. Sloyan
*Attorney, Agent, or Firm*—Stephen A. Young; Walter C. Bernkopf; Robert A. Cahill

[57] ABSTRACT

Apparatus for use in a numerical control system for converting a digitial signal, representing a position of a work piece of material being controlled, to an analog signal for driving a servo motor to correct the position of the work piece. The apparatus includes a circuit for converting a digital signal representing the change in the actual position of the work piece to a plurality of signals representative of digital bits of information representing the error in position of the work piece per unit in time. First and second sets of shift registers for receiving the signals representative of digital bits of information, and at least first and second switches are also provided. Further provided is a circuit for transmitting signals representative of each of the least significant bits of information left within the first and second sets of shift registers, and applying each of the pair of bits of information to respectively control the operation of the first and second switches for predetermined periods of time. The duration of each of the periods of time corresponds to the count of the higher order of the two particular bits which are representative of the signals being transmitted at any particular time. Also provided is an integrator, and a circuit for repetitively applying first and second signals to the integrator at respective magnitudes corresponding to the ratio between the count of each of the two bits represented by the signals being transferred from the respective first and second sets of shift registers at one moment and for a duration controlled by the operation of the first and second switches. An analog signal is thereby obtained from the output of the integrator, which analog signal is equal to the sum of the products of the magnitude of the signals applied to the integrator and the respective predetermined periods of time.

10 Claims, 4 Drawing Figures

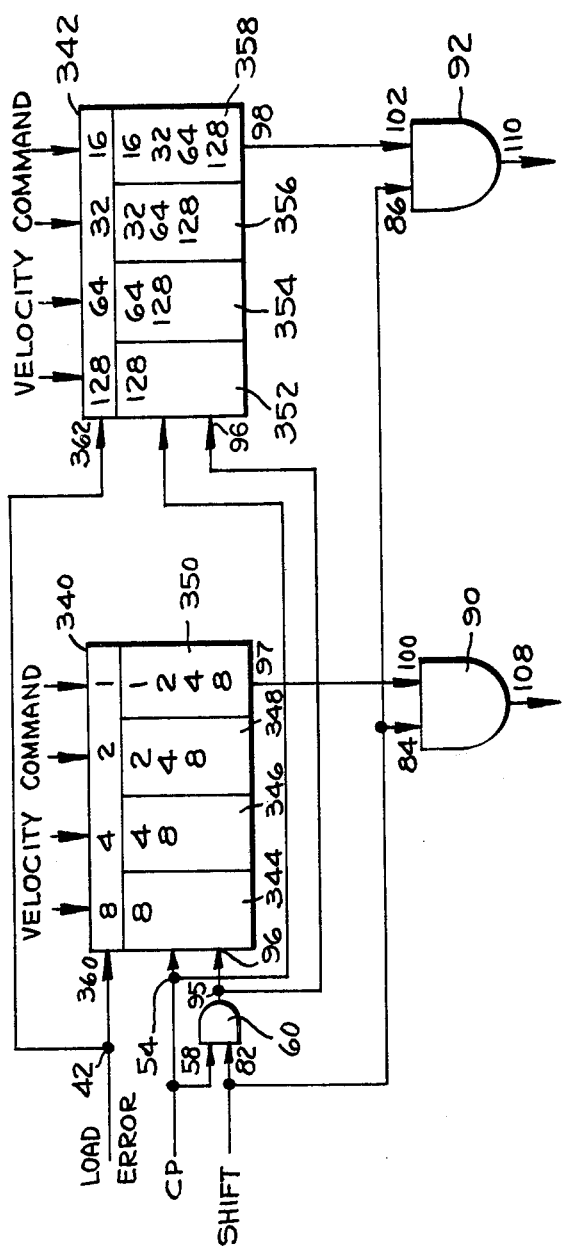
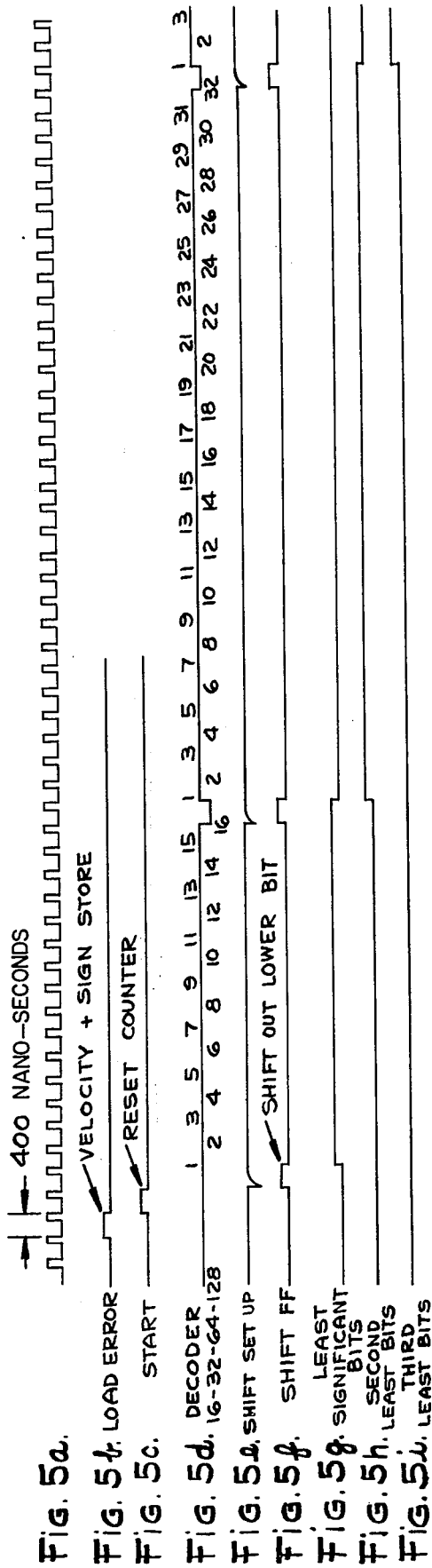
Fig. 4.
Fig. 5a.
Fig. 5b. LOAD ERROR
Fig. 5c. START
Fig. 5d. DECODER 16-32-64-128
Fig. 5e. SHIFT SET UP
Fig. 5f. SHIFT FF
Fig. 5g. LEAST SIGNIFICANT BITS
Fig. 5h. SECOND LEAST BITS
Fig. 5i. THIRD LEAST BITS

APPARATUS FOR CONVERTING A PLURALITY OF SIGNALS REPRESENTATIVE OF DIGITAL BITS OF INFORMATION TO AN ANALOG SIGNAL

BACKGROUND OF THE INVENTION

1. Field of The Invention

This invention relates to apparatus for converting a plurality of signals representative of digital bits of information to an analog signal, and more particularly, to an apparatus for use in a numerical control system for converting a digital signal, representing a change in the actual position of a work piece of material being controlled, to an analog signal for driving a servo motor to correct the position of the work piece.

2. Description of The Prior Art

Numerical control systems are and have been used to control the position and/or path of movement of a work piece upon which a machining operation is to be performed. The actual position of the work piece is monitored and compared to the desired position in order that a position error can be determined. This position error is generally represented in terms of a binary signal which must be converted by a digital to analog converter to an analog signal suitable to drive a servo motor that will be used to correct and/or control the position of the work piece. At times, in systems such as these, the work piece can accumulate a lag or error of as much as 6.4 inches, and if 10,000 pulses or increments per inch are required to accurately represent the position lag or error, 64,000 increments or pulses will be required to represent the error. Digital to analog converters capable of processing such a large accumulation in error would require 16 bits of storage, plus one bit for indication of the polarity of the error. The circuitry required to convert 16 to 17 digital bits of information to an analog signal can actually be far more difficult to construct, and at least six times more expensive than can a comparable 7 to 8 bit digital to analog converter.

OBJECTS OF THE INVENTION

It is therefore an object of this invention to provide an apparatus for converting a digital signal representative of large errors in positioning of a work piece to an analog signal for correcting the error in position of the work piece, which conversion would be accomplished as economically as possible without reducing the operational capability of a numerical control system which incorporates the apparatus.

Other objects of the invention will be pointed out hereinafter.

SUMMARY OF THE INVENTION

According to a broad aspect of the invention, there is provided an apparatus for converting a plurality of signals representative of digital bits of information to an analog signal. The apparatus includes first and second sets of shift registers for receiving the signals representative of the digital bits of information, and at least first and second switch means. Further provided is means for transmitting signals representative of each of the least significant bits of information left within the first and second sets of shift registers, and applying each of the pair of bits of information to respectively control the operation of the first and second switch means for predetermined periods of time. The duration of each of the periods of time corresponds to the count of the higher order of the two particular bits represented by the signals being transmitted. Also provided is an integrator, and means for repetitively applying first and second signals to the integrator at respective magnitudes corresponding to the ratio between the count of each of the two bits represented by the signals being simultaneously transmitted from the respective first and second sets of shift registers at one moment and for a duration controlled by the operation of the first and second switch means. An analog signal is thereby obtained from the output of the integrator, which analog signal is equal to the sum of the products of the magnitude of the signals applied to the integrator and the respective predetermined periods of time.

In accordance with one feature of the invention, the apparatus is for use in a numerical control system for converting a digital signal, representing a change in the actual position of a work piece of material being controlled, to an analog signal for driving a servo motor to correct the position of the work piece, wherein means is provided for converting the digital signal representing the change in the actual position of the work piece to a plurality of signals representative of digital bits of information representing the error in position of the work piece per unit in time.

In accordance with another feature of the invention, the coverting means is comprised of means for multiplexing a first digital signal representative of a change in the actual position of the work piece with a second digital signal representative of a change in the desired position of the work piece to produce a multiplexed digital signal, a digital differential analyzer, a reversible counter, and means for resetting the reversible counter at defined intervals. The digital differential analyzer receives the multiplexed digital signal and performs a computation at the multiplexing rate of the second digital signal to produce an overflow output position error digital signal and a digital signal indicative of the polarity of the position error digital signal. The reversible counter receives the position error digital signal and the digital signal which is indicative of the polarity of the position error digital signal, and the means for resetting the reversible counter causes the generation from the counter of the signals representative of the digital bits of information representing the position error of the work piece per unit in time, and a digital signal indicative of the polarity of the digital bits of information.

According to another feature of the invention, the means for transmitting each of the least significant bits of information left within the first and second sets of shift registers is comprised of first and second storage means, means for generating a series of timing pulses subsequent to the reception of the signals representative of the digital bits of information in the first and second sets of shift registers, means for applying the timing pulses to the first and second sets of shift registers and the first and second storage means to consecutively effect transfer of the signals representative of least significant bits of information left within the first and second sets of shift registers to the respective first and second storage means and to hold the signals representative of each of the successive pairs of bits therewithin for the respective predetermined periods of time, and means for coupling signals representative of each of the successive pairs of bits of information from the first and second storage means to the first and second respective switch means for the respective predetermined periods of time.

According to another feature of the invention, the means for generating the series of timing pulses is comprised of a binary counter comprising a plurality of flip-flop stages responding to a series of clock pulses received after the counter is reset by a start pulse one clock time interval after the signals representative of the digital bits of information are received by the first and second sets of shift registers, decoding means electrically coupled to selected flip-flop output terminals of the binary counter for providing a series of pulses each consecutively indicative of a count equivalent to a respective one of those bits represented by a signal in one set of the shift registers which is of a higher order than the corresponding bit represented by a signal in the other set of shift registers, and means for combining the start pulse and the series of pulses from the decoding means to produce the timing pulses applied to the first and second sets of shift registers and the first and second storage means.

According to another feature of the invention the apparatus for converting a plurality of signals representative of digital bits of information to an analog signal is further comprised of third and fourth switch means, means for repetitively applying third and fourth signals, of equal magnitude but of opposite polarity to the respective first and second signals, to the integrator at respective magnitudes which correspond to the ratio between the count of each of the two bits represented by the signals being simultaneously transmitted from the respective first and second sets of shift registers at one moment and for a duration controlled by the operation of the third and fourth switch means, and logic means electrically coupling the digital signal, which is indicative of the polarity of the digital bits of information, to the first, second, third and fourth switch means for selectively enabling the first and second switch means to allow application of the first and second signals to the integrator when the signals representative of the digital bits of information is of one polarity, and for selectively enabling the third and fourth switch means to allow application of the third and fourth signals to the integrator when the signals representative of the digital bits of information is of a polarity opposite to the one polarity.

BRIEF DESCRIPTION OF THE DRAWINGS

FIG. 4 is a more detailed block diagram of the 8 bit shift register shown in FIG. 1;

FIG. 5 provides an overall timing diagram of the apparatus shown in FIG. 1 wherein:

FIG. 5a depicts the clock pulses applied to the counter and decoder, the shift flip-flop, the 8 bit shift register and the three bit storage register as shown in FIG. 1;

FIG. 5b depicts the load pulse applied to the 8 bit shift register;

FIG. 5c depicts the start pulse applied to the counter and decoder;

FIG. 5d depicts the output pulse generated by the counter and decoder;

FIG. 5e depicts the shift set up pulses applied to the shift flip-flop;

FIG. 5f depicts the shift pulses generated by the shift flip-flop;

FIG. 5g depicts the first predetermined period of time in which the appropriate current switches are enabled, which period corresponds to the higher order ($2^4$) of the least significant bits being integrated;

FIG. 5h depicts the second predetermined period of time in which the appropriate current switches are enabled, which period corresponds to the higher order ($2^5$) of the second least significant bits being integrated; and FIG. 5i depicts the beginning of the third predetermined period of time in which the appropriate current switches are enabled, which period corresponds to the higher order ($2^6$) of the third least significant bits being integrated.

DESCRIPTION OF THE PREFERRED EMBODIMENT

Figure 1:
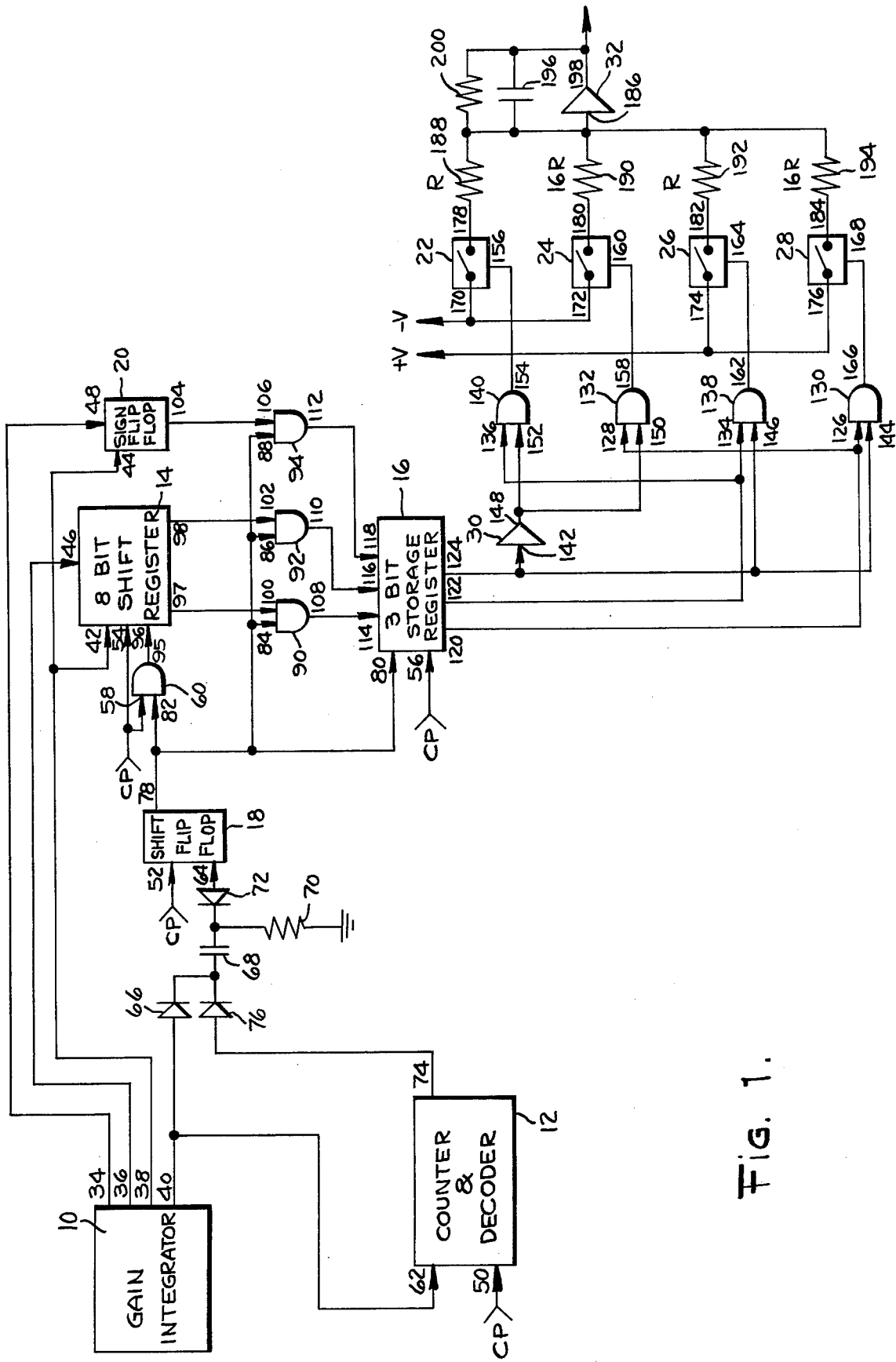
FIG. 1 is an overall block and circuit diagram of the apparatus for converting a plurality of digital bits of information to an analog signal.

Referring now to FIG. 1, an apparatus for use in a numerical control system for converting a digital signal, representing a change in the actual position of a work piece of material being controlled, to an analog signal for driving a servo motor to correct the position of the work piece will now be described.

This apparatus is comprised of a gain integrator 10, a counter and decoder 12, an 8 bit shift register 14, a three bit storage register 16, a shift flip-flop 18, a sign flip-flop 20, first, second, third and fourth current switches 22, 24, 26 and 28, an inverter amplifier 30 and an integrator or operational amplifier 32. Current switches 22, 24, 26 and 28 can be comprised of any suitable type switch, such as a power transistor or other similar types of solid state or electromechanical devices.

Gain integrator 10 is provided with output terminals 34, 36, 38 and 40. A load error signal shown in FIG. 5b is electrically coupled from output terminal 38 of gate integrator 10 to an input terminal 42 of shift register 14 and an input terminal 44 of sign flip-flop 20. A velocity command signal, in the form of a plurality (in this instance 8) digital bits of information, is simultaneously transferred in parallel from output terminal 36 of gain integrator 10 to an input terminal 46 of shift register 14. A velocity error signal comprised of a digital signal indicative of the polarity of the velocity command (8 digital bits of information) signal is electrically coupled from output terminal 34 of gain integrator 10 to an input terminal 48 of sign flip-flop 20. Clock pulses, shown in FIG. 5a, from a master clock generator (not shown), and having a repetition rate in this instance of 400 nano seconds, are respectively applied to respective input terminals 50, 52, 54, 56 and 58 of counter and decoder 12, flip-flop 18, shift register 14, storage register 16, and AND gate 60. A start pulse, shown in FIG. 5c and delayed one clock time after the load error signal, is electrically coupled to an input terminal 62 of counter and decoder 12 and to an input terminal 64 of flip-flop 18 via a steering diode 66, a differentiator circuit, comprising a capacitor 68 and a resistor 70, and a blocking diode 72. As shown in FIG. 1, the cathode of steering diode 66 is electrically coupled to one terminal of capacitor 58, while the other terminal of capacitor 68 is electrically coupled to the juncture between the cathode of diode 72 and one terminal of resistor 70. The other terminal of resistor 70 is electrically connected to a circuit ground, while the anodes of diodes 66 and 72 are respectively connected to output terminal 40 to gain integrator 10 and input terminal 64 of flip-flop 18. An output terminal 74 of counter and decoder 12 provides a decoder signal shown in FIG. 5d which is electrically coupled via a steering diode 76, the differentiator circuit, comprised of capacitor 68 and resistor 70, and blocking diode 72 to input terminal 64 of flip-flop 18. At this point it should be noted that the start and decoder pulses are differentiated by the differentiator circuit and the negative going differentiated pulses are applied to input terminal 64 of shift flip-flop 18 via blocking diode 72 in the form of shift set-up pulses shown in FIG. 5e. Upon application of the shift set-up pulses to shift flip-flop 18, output pulses shown in FIG. 5f are produced at an output terminal 78 of flip-flop 18 having a time duration limited by the next clock pulse received at input terminal 52 of flip-flop 18. These output pulses from flip-flop 18 are electrically coupled to an input terminal 80 of storage register 16, an input terminal 82 of AND gate 60 and input terminals 84, 86 and 88 of respective AND gates 90, 92 and 94. AND gate 60 has an output terminal 95 electrically coupled to an input terminal 96 of shift register 14, and register 14 has first and second output terminals 97 and 98 electrically coupled to respective input terminals 100 and 102 of respective AND gates 90 and 92. Flip-flop 20 has an output terminal 104 which is electrically coupled to an input terminal 106 of AND gate 94. AND gates 90, 92 and 94 have respective output terminals 108, 110 and 112 which are respectively electrically coupled to input terminals 114, 116 and 118 of storage register 16. Storage register 16 is provided with output terminals 120, 122 and 124. Output terminal 120 of storage register 16 is electrically coupled to respective input terminals 126 and 128 of respective AND gates 130 and 132, while output terminal 122 of storage register 16 is electrically coupled to respective input terminals 134 and 136 of respective AND gates 138 and 140. Output terminal 124 of storage register 16 is electrically coupled to an input terminal 142 of inverter 30, and respective input terminals 144 and 146 of respective AND gates 130 and 138. An output terminal 148 of inverter 30 is electrically coupled to respective input terminals 150 and 152 of respective AND gates 132 and 140. AND gate 140 has an output terminal 154 electrically connected to a control input terminal 156 of current switch 22, while AND gate 132 has an output terminal 158 electrically connected to a control input terminal 160 of current switch 24, and AND gate 138 has an output terminal 162 electrically connected to a control input terminal 164 of current switch 26, while AND gate 130 has an output terminal 166 electrically connected to a control input terminal 168 of current switch 28. Respective current terminals 170 and 172 of respective current switches 22 and 24 are electrically connected to a power source (−V), while respective current terminals 174 and 176 of respective current switches 26 and 28 are electrically connected to another power source (+V), wherein each of the power sources are of the same magnitude but of opposite polarity. Each of the other current terminals 178, 180, 182 and 184 of respective current switches 22, 24, 26 and 28 are electrically coupled to an input terminal 186 of integrator 32 via respective resistors 188, 190, 192 and 194. An integrating capacitor 196 is electrically connected between an output terminal 198 of integrator 32 and input terminal 186 of the integrator. Connected in parallel with capacitor 196 is a feedback load resistor 200. The converted analog signal appears at output terminal 198 of integrator 32 and is electrically coupled thereafter to a servomotor within a numerical control system.

Figure 2:
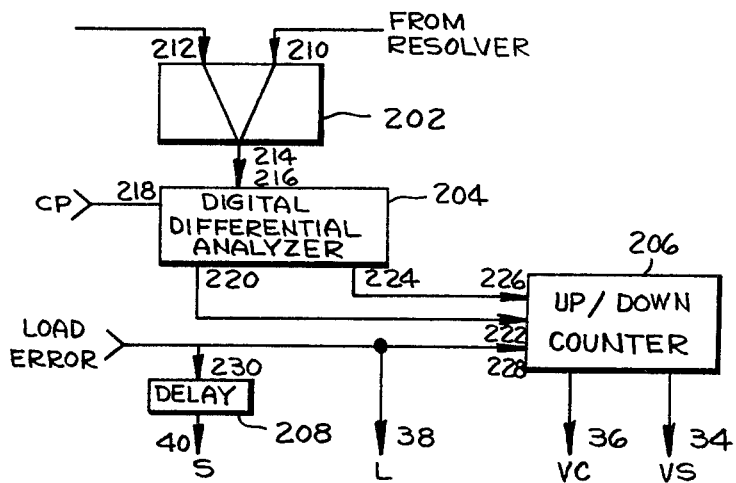
FIG. 2 is a more detailed block diagram of the gain integrator shown in FIG. 1.

Referring to FIG. 2, gain integrator 10 is comprised of a multiplexer 202, a digital differential analyzer (DDA) 204, an up-down (reversible) counter 206, and a delay circuit 208. Multiplexer 202 can be a standard multiplexer circuit, such as a chopper circuit or the like. Digital differential analyzer 204 can be of the same type described in a copending U.S. patent application Ser. No. 499,509, filed Aug. 22, 1974, entitled "Improved Digital Differential Analyzer," inventor Richard L. Friberg, issued into U.S. Pat. No. 3,934,130, and assigned to the same assignee as the assignee of the present invention. The up-down (reversible) counter is a standard component having an 8 bit capacity plus one extra flip-flop or storage register, and delay circuit 208 can be provided by any suitable type of time delay circuit such as a one shot multivibrator or even a properly triggered JK flip-flop for reproducing the load error signal delayed by one clock pulse to provide the start pulse shown in FIG. 5c.

Multiplexer 202 has an input terminal 210 for receiving (from the resolver in the numerical control system) a digital signal representative of the change in the actual position of the work piece. The multiplexer has a second input terminal 212 for receiving a multiplexing signal in the form of a second digital signal that is representative of a change in the desired position of the work piece, which multiplexing signal is received from a path computation unit, and which, in this instance, multiplexes the signal received from the resolver every 20 micro seconds. An output terminal 214 of multiplexer 202 provides a multiplexed digital signal which is electrically coupled to an integrand counter of digital differential analyzer 204 via an input terminal 216 of and an arithmetic unit within the DDA. A clock pulse from a clock pulse generator (not shown), having repetition rate the same (20 micro seconds) as the repetition rate of the multiplexing signal applied to multiplexer 202, is applied to the integrand counter, remainder and remainder size shift registers of the DDA via an input terminal 218 of the DDA. An overflow output position error digital signal is generated from an output of the remainder register within the DDA, and is electrically coupled from an output terminal 220 of the DDA to an input terminal 222 of up-down (reversible) counter 206. At the same time a digital signal indicative of the polarity of the position error signal (the polarity being determined by the condition of the most significant bit within the integrand counter of the DDA) is electrically coupled from an output terminal 224 of the DDA to the extra flip-flop or storage register within reversible counter 206 via an input terminal 226 of counter 206. In order to convert the position error digital signal to a position error signal per unit in time, a load error signal, shown in FIG. 5b and, in this instance, having a repetition rate of 0.4 milli seconds, is electrically coupled to an input terminal 228 of counter 206 to reset the counter and extra storage register and shift out in parallel (simultaneously) a plurality of signals representative of digital bits of information from terminal 36 of gain integrator 10 and the digital signal indicative of the polarity of the digital bits of information from terminal 34 of the gain integrator. At the same time, the load error signal is directly electrically coupled to shift register 14 and sign flip-flop 20 from terminal 38 of the gain integrator, and also to an input terminal 230 of delay 208 to thereby generate the delayed start pulse at output 40 of the gain integrator. Thus as described above multiplexer 202 in combination with digital differential analyzer 204 and reversible counter 206 provide a means for converting the digital signal representing the change in the actual position of the work piece to a plurality of signals representative of digital bits of information representing the error in position of the work piece per unit in time.

Figure 3:
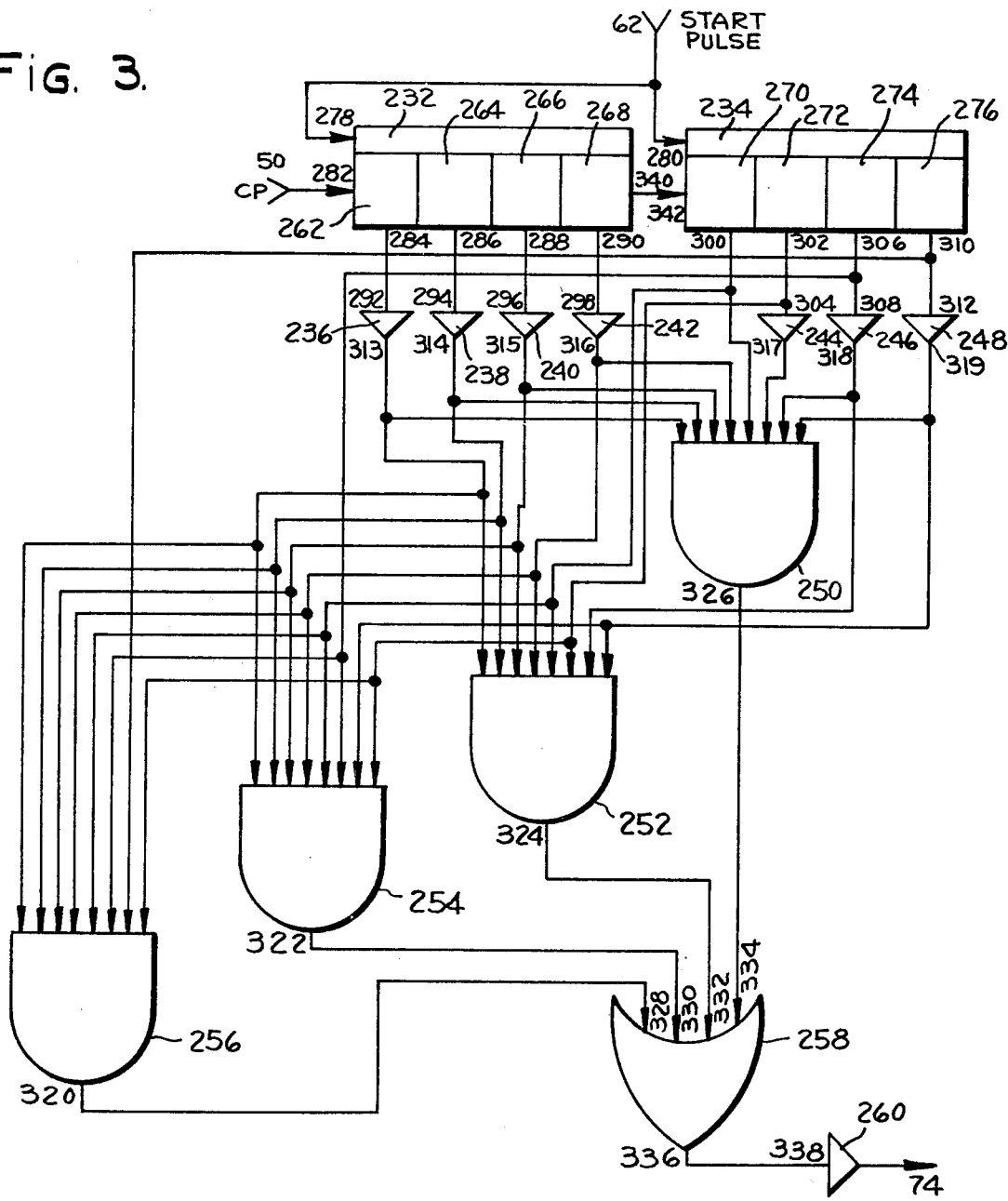
FIG. 3 is more detailed block and circuit diagram of the counter and decoder shown in FIG. 1.

Referring now to FIG. 3, counter and decoder 12 is comprised of first and second counter sections 232 and 234, inverters 236, 238, 240, 242, 244, 246 and 248, AND gates 250, 252, 254, 256, and OR gate 258, and an output inverter 260. Counter section 232 is comprised of a chain of flip-flops 262, 264, 266 and 268, while counter section 234 is comprised of a chain of flip-flops 270, 272, 274 and 276.

The start pulse received at input terminal 62, shown in FIGS. 1 and 3, is applied to respective input terminals 278 and 280 of respective sets of counters 232 and 234 to reset all the flip-flop stages of the counter sets at the negative going edge of the start pulse shown in FIG. 5c. The clock pulses shown in FIG. 5a, and applied to counter and decoder 12 at input terminal 50, is directly applied to an input terminal 282 of flip-flop 262 of counter set 232 to begin the process of generating a count within the counter sets following the resetting of the counter sets by the start pulse. Output terminals 284, 286, 288 and 290 of respective flip-flops 262, 264, 266 and 268 are electrically connected to respective input terminals 292, 294, 296 and 298 of respective inverters 236, 238, 240 and 242. An output terminal 300 of flip-flop 270 of counter set 234 is electrically connected to an input terminal of respective AND gates 250, 252, 254 and 256. An output terminal 302 of flip-flop 272 of counter set 234 is electrically connected to an input terminal 304 of inverter 244 and to an input terminal of AND gates 252, 254 and 256. An output terminal 306 of flip-flop 274 of counter set 234 is electrically connected to an input terminal 308 of inverter 246 and to an input terminal of respective AND gates 254 and 256. An output terminal 310 of flip-flop 276 of counter set 234 is electrically connected to an input terminal 312 of inverter 248 and an input terminal of AND gate 256. Output terminals 313, 314, 315 and 316 of respective inverters 236, 238, 240 and 242 are each electrically connected to an input terminal of respective AND gates 250, 252, 254 and 256. An output terminal 317 of inverter 244 is electrically connected to an input terminal of AND gate 250, while an output terminal 318 of inverter 246 is electrically connected to an input terminal of respective AND gates 250 and 252, and an output terminal 319 of inverter 248 is electrically connected to an input terminal of respective AND gates 250, 252 and 254. Respective output terminals 320, 322, 324 and 326 of respective AND gates 256, 254, 252 and 250 are respectively electrically connected to input terminals 328, 330, 331 and 334 of OR gate 258, while an output terminal 336 of OR gate 258 is electrically connected to an input terminal 338 of inverter 260. The output of inverter 260 is the same as output terminal 74 of counter and decoder 12 shown in FIG. 1.

In operation, after the counter sets are reset by the start pulse, the clock pulses are received by the first counter set until each of the flip-flops of the first counter set have a "1" output level. When the next clock pulse is received, the output levels of the flip-flops of the first counter set return to zero, and the first flip-flop 270 of the second counter set is driven to the "1" output level by a pulse which is transmitted between a terminal 340 of the first counter set and an input terminal 342 of the second counter set. Thus, when flip-flop 270 of the second counter set is at the "1" output level, and the remaining flip-flops of the first and second counter sets are at the zero output level, AND gate 250 is at the "1" output level, thereby driving inverter 260 via OR gate 258 from a positive level to a zero level. When the next clock pulse is received by flip-flop 262, the output level of flip-flop 262 of the first counter set returns to the "1" output level, thereby returning the output of AND gate 250 to the zero level and the output of inverter 260 to the positive "1" output level. This is clearly shown in FIG. 5d wherein a pulse is generated, at output 74 of the counter and decoder, having a negative going edge on the 16th count or pulse received by the counter and decoder following the resetting of the counters by the start pulse and having a positive going edge one clock pulse later. Similarly, as the count proceeds 32 clock pulses following the above referred to 16th clock pulse, the output at flip-flops 270 and 272 are at the "1" output level, while the remaining flip-flops of the first and second counter sets are at the zero level, and a "1" output level signal is generated at the output of AND gate 252, which, in turn, causes a negative going pulse to be generated at output 74 of inverter 260. This is also shown in FIG. 5d. Now 64 clock pulses following the above referred to 32nd clock pulse, the output terminals of flip-flops 270, 272 and 274 are at the "1" output level, while the outputs of the remaining flip-flops of the first and second counter sets are at the zero level, and a "1" output level is generated at the output of AND gate 254, which, in turn, causes the generation of a negative going pulse at the output of inverter 260 (not shown in FIG. 5d). Similarly 128 clock pulses after the above referred to 64th clock pulse has been received, the output terminals of flip-flops 270, 272, 274 and 276 are at the "1" output level, while the remaining flip-flops of the first counter set are at the zero level. This causes a "1" output level to be generated at the output of AND gate 256, which, in turn, causes the generation of a negative going pulse at the output of inverter 260. Thus negative going output pulses are generated at output terminal 74 of the counter and decoder 12, 16 clock pulses after the initial resetting of the first and second counter sets by the negative edge of the start pulse, 32 clock pulses following the above referred to 16th clock pulse, 64 clock pulses following the above referred to 32nd clock pulse, and 128 clock pulses following the above referred to 64th clock pulse, respectively. These pulses generated from the output terminal 74 of counter and decoder 12 are differentiated by the differentiator comprised of capacitor 68 and resistor 70, and the negative going differentiated pulses pass through blocking diode 72 to trigger flip-flop 18 exactly on the 16th count or clock pulse following the negative going edge of the start pulse, and the respective 32nd, 64th and 128th count following the previous differentiated pulse.

Referring now to FIG. 4, 8 bit shift register 14 is comprised of first and second register sets 340 and 342. First register set 340 is comprised of flip-flops 344, 346, 348 and 350, while second register set 342 is comprised of flip-flops 352, 354, 356 and 358. Thus, as previously explained above, and shown in FIG. 5b, on the negative going edge of the load error signal applied to respective input terminals 360 and 362 of register sets 340 and 342, the velocity command signal containing the plurality of signals representative of the digital bits of information are loaded simultaneously (in parallel) into each of the flip-flops of the first and second sets of registers. Further shown in FIG. 4 are the bit levels received by each of the flip-flops of the first and second sets of registers. Thus flip-flops 350 receives the bit level represented by the digital bit $2^0$, or decimal number 1; flip-flop 348 representing the digital bit $1^1$ or decimal number 2; filp-flop 346 representing the digital bit $2^2$ or decimal number 4; flip-flop 344 representing the digital bit $2^3$ or decimal number 8; flip-flop 358 representing the digital bit $2^4$ or decimal number 16; flip-flop 356 representing the digital bit $2^5$ or decimal number 32; flip-flop 354 representing the digital bit $2^6$ or decimal number 64; and flip-flop 352 representing digital bit $2^7$ or decimal number 128. Thus flip-flop 350 of register set 340 and flip-flop 358 of register set 342 at any one time store therein the least significant bit of their respective register set, wherein the ratio of the least significant bit in flip-flop 358 of register set 342 to the least significant bit in flip-flop 350 of register set 340 is always 16 to 1.

In operation when the first shift pulse, shown in FIG. 5f, is received from output terminal 78 of flip-flop 18, shown in FIG. 1, and applied to input terminal 82 of AND gate 60, the least significant bits $2^0$ and $2^4$ within respective flip-flops 350 and 358 of respective register sets 340 and 342 are transferred thereout via respective terminals 97 and 98, and are applied to respective AND gates 90 and 92 and shifted into respective first and second storage means or registers within 3 bit storage register 16 via respective first and second terminals 114 and 116 shown in FIG. 1. While the least significant bits $2^0$ and $2^4$ are being shifted out of respective flip-flops 350 and 358, bits $2^3$ and $2^7$ are being shifted to respective flip-flops 346 and 354, bits $2^2$ and $2^6$ are being shifted to respective flip-flops 348 and 356, and bits $2^1$ and $2^5$ are transferred to respective flip-flops 359 and 358 and become the least significant bits stored within respective register sets 340 and 342. At the same time, the shift pulse transfers the digital information from output terminal 104 of sign flip-flop 20 to a third storage means or register within the three bit storage register 16 via input terminal 118 shown in FIG. 1. 16 clock pulses later, again referring to FIG. 5f, a second shift pulse is received by the first and second register sets and the least significant bits $2^1$ and $2^5$ stored within respective flip-flops 350 and 358 of respective register sets 340 and 342 are shifted thereout and into the respective first and second storage registers of three bit storage register 16. Bits $2^3$ and $2^7$ are also shifted to respective flip-flops 348 and 356, while bits $2^2$ and $2^6$ are transferred to respective flip-flops 350 and 358 and become the least significant bits stored within respective register sets 340 and 342. Similarly, when the next shift pulse is received 32 clock pulses later, the least significant bits $2^2$ and $2^6$ within respective flip-flops 350 and 358 of respective first and second register sets 340 and 342 are transferred thereout and to the respective first and second storage registers within 3 bit storage register 16. Bits $2^3$ and $2^7$ are simultaneously transferred to respective flip-flops 350 and 358 and become the least significant bits stored within respective register sets 340 and 342. Then 64 clock pulses later, another shift pulse is received by the first and second sets of shift registers and the final bits $2^3$ and $2^7$ remaining within respective flip-flops 350 and 358 of respective first and second register sets 340 and 342 are shifted thereout and into the respective first and second storage registers within 3 bit storage register 16. These final bits remain within their respective storage registers until they are finally cleared and shifted out by a shift pulse applied to respective terminals 116 and 118 of the 3 bit storage register at a time equivalent to 128 clock pulses following the proceeding shift pulse.

At this point it should be noted that the counter and decoder, steering diodes 66 and 76, the differentiator circuit and blocking diode 72 provide a means for generating a series of timing pulses subsequent to the reception of the signals representative of the digital bits of information in the first and second shift registers wherein the time between the initial timing pulse generated by the start pulse and the next successive timing pulse is determinative of a first predetermined period of time which corresponds to the highest of the least significant bit of information within the first and second registers i.e. digital bit $2^4$ or 16 clock pulses, and the time between each successive timing pulse and the preceeding time pulse is determinative of the following successive predetermined periods of time which successively correspond to digital bit $2^5$ or 32 clock pulses, digital bit $2^6$ or 64 clock pulses and digital bit $2^7$ or 128 clock pulses.

As noted above, the successive least significant bits from first register set 340 are stored in the first register within storage register 16, wherein the stored bit status therewithin is electrically coupled via terminal 120 to AND gates 130 and 132, while the successive least significant bits from second register set 342 are stored within the second register within storage register 16, wherein the stored bit status therewithin is electrically coupled via output terminal 122 to AND gates 138 and 140. If the signal stored within the third register of storage register 16 indicates that the signals representative of the digital bits of information is of one polarity, the third register has a "1" output level, and AND gates 130 and 138 are selected to be enabled, while AND gates 132 and 140 are prevented from being enabled. Similarly, if the signal stored within the third register of storage register 16 indicates that the signals representative of the digital bits of information are of an opposite polarity, at terminal 124 of storage register 16 the output level is zero, thereby preventing AND gates 130 and 138 from being enabled, while selecting AND gates 132 and 140 to be enabled. When AND gates 130 and 138 are selected to be enabled, current switches 28 and 26 are respectively enabled when the respective bits stored within the respective first and second registers of storage register 16 produce a "1" level at respective output terminals 120 and 122, while current switches 24 and 22 are disabled. Similarly, when AND gates 132 and 140 are enabled, respective current switches 24 and 22 are enabled when the respective bits stored within the respective first and second registers of storage register 16 produce a "1" level at respective output terminals 120 and 122, while current switches 28 and 26 are disabled. The selected current switches are thus enabled for a duration equal to a number of clock pulses which is equal to and determined by the higher order of the particular pair of bits stored within the first and second registers of storage register 16.

Thus, as described above, a means for consecutively transmitting signals representative of each of the least significant pair of bits of information left within first and second sets of shift registers simultaneously, and for applying signals representative of each of the pair of bits of information to respectively control the operation of the current switches for predetermined periods of time, is provided by the combination of the previously described means for generating the series of timing pulses, flip-flops 18 and 20, AND gates 60, 90, 92 and 94, storage register 16, inverter 30 and AND gates 130, 138, 132 and 140.

The ratio of the resistance of resistor 194 of the resistance of resistor 192 is 16 to 1, and the ratio of the resistance of resistor 190 to the resistance of resistor 188 is also 16 to 1. This ratio is fixed to correspond to the ratio between each of the bits represented by the signals of a particular pair of bits being applied to the control terminals of the current switches at any one moment in time. Thus, if current switches 26 and 28 were enabled, the current applied to input terminal 186 of integrator 32 would be effectively weighted in magnitude in accordance with the count of the bit. For instance, if the bit corresponding to $2^0$ were applied to current switch 28, while the bit corresponding to $2^4$ were applied to current switch 26, the current flowing through resistor 192 would be 16 times greater than the current flowing through resistor 194, so as to proportionally weigh the magnitude of the current signals applied to the input of the integrator 32 to coincide with the actual ratio between the order of the two particular bits of information represented by the signals being applied to the current switches and effectively applied to the integrator at any one particular time. Of course each of the current switches is enabled for a predetermined period of time which is equal to the number of clock pulses corresponding to the higher order of either of the two bits represented by the signals being integrated at one particular time. Thus, in this manner, a continuous integration of the signals representative of the 8 digital bits of information can be made at the integrator over four consecutive periods of time using the above "current weighing" and "current on time" techniques.

The operation of the above apparatus for converting a plurality of signals representative of digital bits of information to an analog signal will now be summarized. At the start of the integrating cycle, the load error pulse, which has a repetition rate in this instance of 0.4 milli seconds, is applied from output terminal 38 of gain integrator 10 to respective input terminals 42 and 44 of shift register 14 and sign flip-flop 20. On the negative going edge of the load error pulse, the velocity command signal represented by a plurality of signals representative of digital bits of information, is simultaneously transmitted to 8 bit shift register 14, and at the same time the digital signal which is indicative of the polarity of the bits of information received in the first and second sets of shift registers is also transmitted to the sign flip-flop 20. Upon application of the start pulse from output terminal 40 of gain integrator 10, and at a time coinciding with the negative going edge of the start pulse, a shift set up pulse is applied to flip-flop 18 and the flip-flops of counter and decoder 12 are reset. The shift set up pulse applied to the input of flip-flop 18 causes the generation of a shift pulse shown in FIG. 5f. The negative going edge of the shift pulse causes the signals representative of the least significant bits of information in each of the sets of shift registers to be transmitted to first and second registers of storage register 16, and at the same time the digital signal indicative of the polarity of the plurality of signals representative of digital bits of information is transmitted to the third register of storage register 16. Upon transfer of the signals representative of the first pair of digital bits of information to the first and second registers of storage register 16, as shown in FIG. 5g, the least significant bits are applied to control either current switches 22 and 24 or 26 and 28, depending upon the polarity of the plurality of signals representative of digital bits of information as determined by the digital signal stored within the third register of storage register 16. Thus the selected current switches 22 and 24 or 26 and 28 can be enabled to allow current to flow through their appropriate resistors at magnitudes proportional to the ratio of the two particular bits represented by the signals being transmitted. 16 clock pulses after the flip-flops of the first and second sets of counters are reset, the counter and decoder produces an output pulse shown in FIG. 5d, wherein the negative going edge of the pulse generates a shift set up pulse at input 64 of flip-flop 18. This shift set up pulse causes the generation of a shift pulse at the output of flip-flop 18, as shown in FIG. 5f. The negative going edge of the shift pulse causes the signals representing the least significant bits now remaining within the first and second sets of shift registers to be transferred to the first and second registers of storage register 16. This causes a termination of the first predetermined time period as shown in FIG. 5g, whereupon the signals representing the next successive pair of bits then begin to control their respective current switches. This process continues until the signals representing each of the succeeding pairs of bits of information are successively applied to the appropriate current switches, and the plurality of signals representative of digital bits of information are converted to an analog signal.

Although this invention has been described with reference to a specific embodiment thereof, numerous modifications are possible without departing from the invention, and it is desirable to cover all modifications falling within the spirit and scope of this invention.

What we claim as new and desire to secure by Letters Patent of the United States is:

1. Apparatus for converting a plurality of signals representative of digital bits of information to an analog signal comprising:
 a. first and second sets of shift registers for receiving the signals representative of the digital bits of information, each of said sets including a plurality of stages, wherein the last stage of each of said sets stores a signal representative of the least significant bit remaining within its respective set;
 b. at least first and second switch means;
 c. first and second storage means;
 d. means for generating a series of timing pulses subsequent to the reception of the signals representative of the digital bits of information in said first and second sets of shift registers, the time between an initial timing pulse and a next successive timing pulse being determinitive of a first predetermined period of time, and the time between each successive timing pulse and the preceeding timing pulse being determinitive of successive predetermined periods of time;
e. means for applying said timing pulses to said first and second sets of shift registers and said first and second storage means, wherein each timing pulse effects the advance of the signals representative of digital bits of information left within stages other than the last stage of each set toward the respective last stage, and also effects the transfer of signals representative of the least significant bit of information left within each respective last stage of said respective first and second storage means to be stored therewithin for the respective predetermined period of time, the duration of each of the predetermined periods of time corresponding to the count of the higher order of the signals representative of the two particular bits being transferred to said respective first and second storage means;
f. means for coupling signals representative of each of successive pairs of bits of information from said first and second storage means to said first and second respective switch means to control the operation thereof for the respective predetermined periods of time;
g. an integrator; and
h. means for repetitively applying first and second signals to said integrator at respective magnitudes corresponding to the ratio between the count of each of the two bits represented by the signals being simultaneously transferred from said respective last stages of said first and second sets of shift registers at one moment, and for a duration controlled by the operation of said first and second switch means, whereby an analog signal is obtained from the output of said integrator, which analog signal is equal to the sum of the products of the magnitude of the signals applied to said integrator and the respective predetermined periods of time.

2. Apparatus for converting a plurality of signals representative of digital bits of information to an analog signal according to claim 1, wherein the signals representative of the digital bits of information are simultaneously received by said first and second sets of shift registers.

3. Apparatus for converting a plurality of signals representative of digital bits of information to an analog signal according to claim 1, wherein said generating means is comprised of:
a. a binary counter comprised of a plurality of flip-flop stages responding to a series of clock pulses received after said counter is reset by a start pulse one clock time interval after the signals representative of the digital bits of information are received by said first and second sets of shift registers;
b. decoding means electrically coupled to selected flip-flop output terminals of said binary counter for providing a series of pulses each consecutively indicative of a count equivalent to a respective one of those bits in one set of said shift registers which is of a higher order than the corresponding bit in the other set of said shift registers; and
c. means for combining the start pulse and the series of pulses from said decoding means to produce said timing pulses applied to said first and second set of shift registers and said first and second storage means.

4. Apparatus for converting a plurality of signals representative of digital bits of information to an analog signal according to claim 1, further comprising means for receiving a digital signal indicative of the polarity of signals representative of the bits of information received in said first and second sets of shift registers.

5. Apparatus for converting a plurality of signals representative of digital bits of information to an analog signal according to claim 4, further comprising:
a. third and fourth switch means;
b. means for repetitively applying third and fourth signals to said integrator at respective magnitudes corresponding to the ratio between the count of each of the two bits represented by the signals being simultaneously transferred from said respective last stages of said first and second sets of shift registers at one moment and for a duration controlled by the operation of said third and fourth switch means, said third and fourth signals being of equal magnitude but of opposite polarity to said respective first and second signals; and
c. logic means electrically coupling said digital signal receiving means to said first, second, third and fourth switch means for selectively enabling said first and second switch means to allow application of said first and second signals to said integrator when the signals representative of the digital bits of information is of one polarity, and for selectively enabling said third and fourth switch means to allow application of said third and fourth signals to said integrator when the signals representative of the digital bits of information is of a polarity opposite to said one polarity.

6. Apparatus for use in a numerical control system for converting a digital signal representing a position of a work piece of material being controlled to an analog signal for driving a servomotor to correct the position of the work piece, comprising:
a. means for converting the digital signal representing the change in the actual position of the work piece to a plurality of signals representative of digital bits of information representing the error in position of the work piece per unit in time, said converting means comprising:
1. means for multiplexing a first digital signal representative of a change in the actual position of the work piece with a second digital signal representative of a change in the desired position of the work piece to produce a multiplexed digital signal;
2. means receiving the multiplexed digital signal for producing a position error digital signal and a digital signal indicative of the polarity of the position error digital signal;
3. a reversible counter for receiving the position error digital signal and the digital signal indicative of the polarity of said position error digital; and
4. means for resetting said reversible counter at defined intervals to generate therefrom the plurality of signals repsentative of digital bits of information representing the position error of the work piece per unit in time and a digital signal indicative of the polarity of the signals representative of the digital bits of information.

b. first and second sets of shift registers for receiving the signals representative of the digital bits of information, each of said sets including a plurality of stages, wherein the last stage of each of said sets stores a signal representative of the least significant bit remaining within its respective set;

c. at least first and second switch means;

d. first and second storage means;

e. means for generating a series of timing pulses subsequent to the reception of the signals representative of the digital bits of information in said first and second sets of shift registers, the time between an initial timing pulse and a next successive timing pulse being determinitive of a first predetermined period of time, and the time between each successive timing pulse and the preceeding timing pulse being determinitive of successive predetermined periods of time;

f. means for applying said timing pulses to said first and second sets of shift registers and said first and second storage means, wherein each timing pulse effects the advance of the signals representative of digital bits of information left within stages other than the last stage of each set toward the respective last stage, and also effects the transfer of signals representative of the least significant bit of information left within each respective last stage to said respective first and second storage means to be stored therewithin for the respective predetermined period of time, the duration of each of the predetermined periods of time corresponding to the count of the higher order of the signals representative of the two particular bits being transferred to said respective first and second storage means;

g. means for coupling signals representative of each of successive pairs of bits of information from said first and second storage means to said first and second respective switch means to control the operation thereof for the respective predetermined periods of time;

h. an integrator; and i. means for repetitively applying first and second signals to said integrator at respective magnitudes corresponding to the ratio between the count of each of the two bits represented by the signals being simultaneously transferred from said respective last stages of said first and second sets of shift registers at one moment, and for a duration controlled by the operation of said first and second switch means, whereby an analog signal is obtained from the output of said integrator, which analog signal is equal to the sum of the products of the magnitude of the signals applied to said integrator and the respective predetermined periods of time.

7. Apparatus for use in a numerical control system according to claim 6, wherein the signals representative of the digital bits of information are simultaneously received by said first and second sets of shift registers.

8. Apparatus for use in a numerical control system according to claim 6, wherein said generating means is comprised of:

a. a binary counter comprised of a plurality of flip-flop stages responding to a series of clock pulses received after said counter is reset by a start pulse one clock time interval after the signals representative of the digital bits of information are received by said first and second sets of shift registers;

b. decoding means electrically coupled to selected flip-flop output terminals of said binary counter for providing a series of pulses each consecutively indicative of a count equivalent to a respective one of those bits in one set of said shift registers which is of a higher order than the corresponding bit in the other set of said shift registers; and c. means for combining the start pulse and the series of pulses from said decoding means to produce said timing pulses applied to said first and second sets of shift registers and said first and second storage means.

9. Apparatus for use in a numerical control system according to claim 6, further comprising means for receiving the digital signal indicative of the polarity of the plurality of signals representative of bits of information received in said first and second sets of shift registers.

10. Apparatus for use in a numerical control system according to claim 9, further comprising:

a. third and fourth switch means;

b. means for repetitively applying third and fourth signals to said integrator at respective magnitudes corresponding to the ratio between the count of each of the two bits represented by the signals being simultaneously transferred from said respective last stages of said first and second sets of shift registers at one moment, and for a duration controlled by the operation of said third and fourth switch means, said third and fourth signals being of equal magnitude but of opposite polarity to said respective first and second signals; and c. logic means electrically coupling said digital signal receiving means to said first, second, third and fourth switch means for selectively enabling said first and second switch means to allow application of said first and second signals to said integrator when the signals representative of the digital bits of information is of one polarity, and for selectively enabling said third and fourth switch means to allow application of said third and fourth signals to said integrator when the signals representative of the digital bits of information is of a polarity opposite to said one polarity.

* * * * *